United States Patent [19]

Brownell

[11] Patent Number: 4,591,547
[45] Date of Patent: May 27, 1986

[54] DUAL LAYER POSITIVE PHOTORESIST PROCESS AND DEVICES

[75] Inventor: Terry Brownell, East Setauket, N.Y.

[73] Assignee: General Instrument Corporation, New York, N.Y.

[21] Appl. No.: 618,529

[22] Filed: Jun. 8, 1984

Related U.S. Application Data

[63] Continuation of Ser. No. 436,774, Oct. 20, 1982, abandoned.

[51] Int. Cl.$^4$ .................................. G03C 5/00
[52] U.S. Cl. ........................... 430/312; 430/313; 430/314; 430/328; 430/331; 430/394; 430/330
[58] Field of Search ............... 430/312, 330, 260, 313, 430/314, 328, 331, 394

[56] References Cited

U.S. PATENT DOCUMENTS

| | | | |
|---|---|---|---|
| 4,088,490 | 5/1978 | Duke et al. | 430/312 |
| 4,201,800 | 5/1980 | Alcorn et al. | 430/5 |
| 4,376,658 | 3/1983 | Sigusch | 148/1.5 |

FOREIGN PATENT DOCUMENTS

| | | | |
|---|---|---|---|
| 54-162490 | 12/1979 | Japan | 430/314 |
| 56-10930 | 2/1981 | Japan | 430/312 |

Primary Examiner—John E. Kittle
Assistant Examiner—José G. Dees
Attorney, Agent, or Firm—Roland Plottel

[57] ABSTRACT

A method of fabricating a semiconductor device including the steps of forming a first layer of positive photoresist on a substrate surface; exposing selected portions of the photoresist; developing the photoresist to remove those portions which are exposed and leave those portions which are not. Then, plasma etching the substrate and the unexposed resist so that the etch fixes the photoresist. Subsequently forming a second layer of photoresist over the fixed first layer and over the etched substrate. Finally, exposing and developing selected portions of the second layer of photoresist in a pattern which is noncongruent with fixed first photoresist layer. This forms a selective double photoresist layer with the second layer over the fixed first layer, and may also provide single layers of either the first or second photoresist.

6 Claims, 6 Drawing Figures

DUAL LAYER POSITIVE PHOTORESIST PROCESS AND DEVICES This application is a continuation of application Ser. No. 436,774, filed Oct. 20, 1982 abandoned.

BACKGROUND OF THE INVENTION

I. Field of the Invention

The invention relates generally to semiconductor integrated circuits and processes for their manufacture, and more particularly to an intermediate integrated circuit, having a dual layer positive photoresist, and a dual layer positive photoresist process for the manufacture of integrated circuits.

II. Descrpition of the Prior Art

In the manufacture of integrated circuits, it is well known to use a photo lithographic technique to form an image or pattern in a photoresist emulsion on the semiconductor substrate. The pattern then serves as a mask for subsequent etching of the underlying substrate, or for the introduction of dopants into the underlying substrate. The substrate is covered with a layer of photographic emulsion called photoresist and light or other radiation is applied to selected portions of the emulsion. This causes a selective polymerization of the resist. The unpolymerized resist is then developed or dissolved and removed. This leaves a pattern on the surface of the substrate of openings or windows in the photoresist layer. There are two types of photoresist, negative and positive. A negative resist or light hardening resist is one in which light from the exposure process hardens or polymerizes the photoresist. A postive photoresist, or light softened resist, is one in which the light from the exposure process softens or depolymerizes the photoresist. This process, and its place in the overall manufacture of integrated circuits, is known and those who wish more information are referred to the textbooks and articles in the field, for example, Raymond M. Warner, *Integrated Circuits* (New York: McGraw-Hill, 1965), pp. 150 and 151 in particular. And Peter E. Gise, *Semiconductor and Integrated Circuit Fabrication Techniques* (Rustern, Virginia: Prentice-Hall, 1970), pp. 104–109. The Warner text describes only negative photoresist, while Gise describes negative and positive. Both books describe also the step of photoresist and photo lithography in the overall manufacture of integrated circuits. Multiple masking and several photo lithographic steps are used in the manufacture of modern integrated circuits.

The present invention relates to the use of positive photoresist. In certain process steps, it is desirable to have a double layer of photoresist over portions of the substrate, and a second layer of photoresist over part of the first layer, but not all of the first layer of photoresist. An example is in the manufacture of programmable roms, it is necessary to provide additional protection during an ion field implant for nitride lines on the substrate. For example, it is desirable to implant with energy of 90 KEV, which is possible with a dual layer photoresist, while with a single layer resist only approximately 35 KEV may be used. The difficulty in using positive photoresist is that the portions of the first layer, which remain and are covered by the second positive photoresist layer and which are exposed to light in the second photo lithographic technique, are subject to being removed by a softened and depolymerized during the exposure of the second photoresist. Further, the portions of the first photoresist layer remaining during the second photoresist may be subject to being dissolved, wrinkled due to heat, lose their dimensional and chemical integrity.

An object of the present invention is to provide a dual layer positive photoresist process in which two layers of positive photoresist may be used one at least partially over the other. Also an object of the invention is intermediate semiconductive device that includes at least two layers of positive photoresist on the substrate with other parts having only the first layer of positive photoresist on the substrate.

Another object of the invention is to provide a repeatable dual layer photoresist process employing positive photoresist that may be used in an industrial setting with commercial acceptable reproducibility and high yield.

A further object of the invention is to provide a dual layer positive photoresist in which the first resist retains its integrity until after the second photoresist layer has been applied and then all the processing steps that are needed are performed until both photoresists are stripped; and in which the second positive photoresist may be satisfactorily applied and used until it has all been removed.

SUMMARY OF THE INVENTION

According to one aspect of the invention, there is provided a method of fabricating a semiconductor device. It includes the steps of forming a first layer of positive photoresist on a substrate surface; exposing selected portions of said photoresist layer; developing said layer to remove those portions which were exposed and leaving other portions which were not exposed; plasma etching said substrate and said resist so that the plasma etch fixes the remaining photoresist; forming a second layer of photoresist over the fixed first layer and over the etched substrate; then finally, exposing and developing selected portions of the second layer of photoresist in a pattern non-congruent with the fixed first photoresist layer, thus forming a double photoresist layer with the second layer over the fixed first layer.

According to another aspect of the invention, there is provided an intermediate semiconductor device having a substrate and a first mask of a fixed positive photoresist over selected portions of substrate.

DETAILED DESCRIPTION OF THE INVENTION

Figure 1:
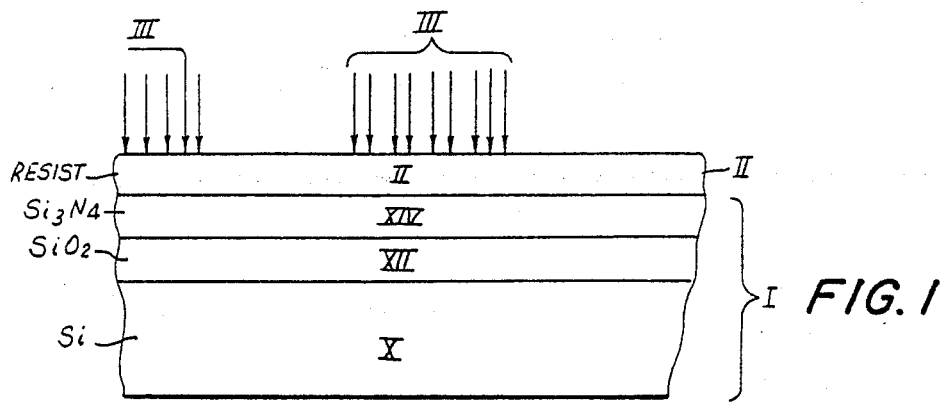
FIGS. 1-5 are partial cross-sectional views, not to scale, showing a substrate and resist layers illustrating an aspect of the process of the invention.

In FIG. 1 there is a shown a substrate I and a layer of positive photoresist II, a portion of which is being exposed to light or radiation shown with legend III. The substrate I has a silicon body X, with a layer of silicon dioxide XII which, in turn, has a layer of silicon nitride XIV thereon. The positive photoresist II is next to the silicon nitride layer XIV. FIG. 1, as well as all figures in the drawings, are not to scale. The SiO2 layer XII is, for example, 700 angstroms thick, the Si3N4 layer XIV is 1200 angstroms thick, and the positive photoresist II is about 12,000 angstroms thick.

Figure 2:
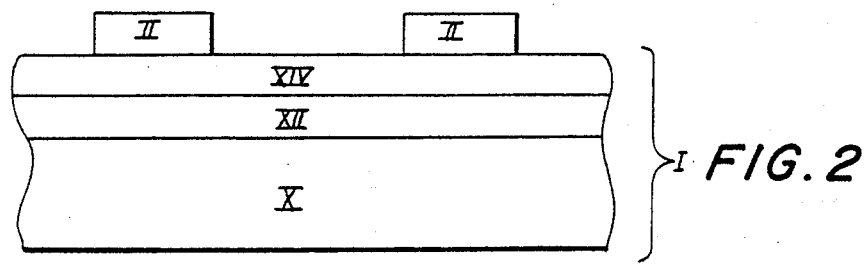

Since the photoresist II is positive, the light III from the exposure process softens or depolymerizes the photoresist in those regions where the light impinges on the photoresist. The wafer is then developed and the softened or depolymerized resist is removed. This is shown in FIG. 2.

Figure 3:
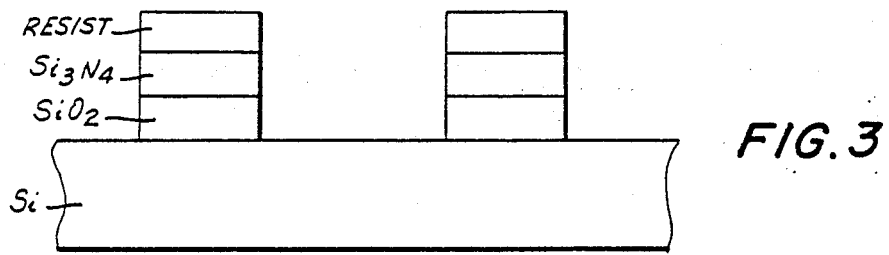

The wafer is then subjected to a plasma etch, the results of which are shown in FIG. 3. The etch with the remaining resist II as a mask, etches, i.e., removes, the exposed portion of the Si3N4 layer XIV and SiO2 layer XII. More importantly, in the present invention, the plasma fixes the unexposed resist II in FIG. 3 and renders the resist impervious to further exposure to light and solvents, and to some extent high temperature. It is believed that a "skin" is formed on the outer surface of the resist II in FIG. 3. It renders the resist impervious to further exposure in solvents and also allows it to be baked at 50° to 100° C. higher than its normal flow point, which is approximately 90° C.

Figure 4:
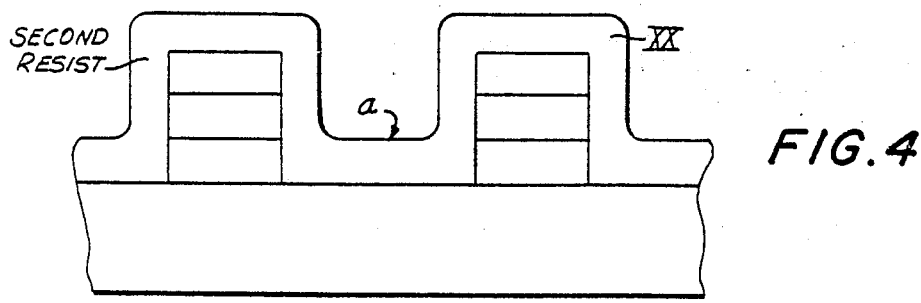

As shown in FIG. 4, the next step is to apply a second layer of positive photoresist XX. It covers the remaining portion of the first layer of photoresist II. This second layer of positive photoresist is then exposed to light, for example that portion of the wafer which is to the left in FIG. 2 of point a is exposed, and the portion on the wafer to the right of the point a in FIG. 4 is not exposed. Since this is positive photoresist, light from the exposure softens or depolymerizes the photoresist to the left of point a.

Figure 5:
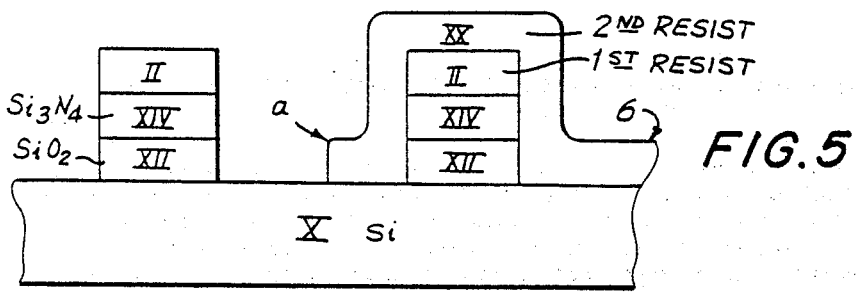

As shown in FIG. 5, the exposed photoresist is then developed which dissolves the exposed depolymerized or softened photoresist. This leaves the device shown in part in FIG. 5. In FIG. 5 there is shown body X, and to the right a layer of silicon dioxide XII, an overlayer of silicon nitride XIV, a first photoresist layer II, and an overlying layer of second photoresist XX, which extends beyond the first photo layer II onto the etched substrate in contact with the body X.

In FIG. 5, to the left there is shown the body X, with the overlying layer of silicon dioxide XII, silicon nitride XIV, and the first photoresist II which has been fixed during a prior step and thus was not attacked or removed during the second photoresist application exposure or development.

In typical application, the step after what is shown in FIG. 5 is to implant, for example, boron in a field implant using a high energy, for example 90 KEV. The double photoresist layer to the right in FIG. 5 is sufficient to protect the underlying silicon nitride lines from the implant.

A first preferred embodiment of carrying out the process of the invention may be described in detail as follows. One begins with wafers having 1200 angstroms of Si3N4 over 750 angstroms of SiO2.

The wafers are first baked at 200° C. for thirty minutes to dry them and prepare them for coating with the first photoresist.

A coat of 100% each MDS is spun dry at 3200 RPMs. HMDS increases the adherence of the photoresist to the silicon nitride layer.

There is then coated a photoresist commercially known as AZ 111S, and it is spin coated at 3200 RPMs.

The photoresist is then baked for 15 minutes at 95° C.

A first mask then exposes selected portions of the photoresist. A Perkin Elmer projection aligner type 221 was used. This step corresponds to FIG. 1 of the drawing.

The exposed photoresist is then developed in a commercial type AZ 311 developer, 2:3, distilled water at 22° C. This is followed by a bake at 85° C. for 20 minutes. The device now appears as shown in FIG. 2.

A plasma etch is then carried out, preferably in a Planar etcher. A Branson sigma etcher was used for 30 seconds at 3.6 TORR, 300 watts, using a plasma of 5 SCCM of O2, 450 SCCM of CF4, and 30 SCCM CCLF3.

The etched step is important in two respects. First, it fixes the photoresist so the photoresist is hardened. This makes the fixed photoresist neither photosensitive to further light, nor dissolvable by the usual solvents which are used in the subsequent steps. There is an additional feature in that the fixing allows the wafer to be baked in subsequent steps at 50° to 100° C. higher than the normal flow point of the unfixed photoresist. The unfixed normal flow point is about 90° C.

The plasma exposure generates, it is believed, a chemical change in the photoresist and specifically the outer layer or "skin" which controls the resist left unexposed in the first layer.

The plasma is what fixes the first layer, and experimentation has indicated that it is energy-sensitive. A minimum of 6 watts/CM2 have been found satisfactory. In a commercial plasma etcher with 300 watts at 3.6 TORR, the skin is fixed in about one second.

In the example shown in FIG. 3, the etch is continued for thirty seconds. This is to etch the substrate and particularly through the Si3N4 layer XIV and SiO2 layer XII, which is not covered by the resist II. The mask II in FIG. 3 retained its integrity during the etching.

The wafer is then baked at 150° C. for 35 minutes We noted that this temperature is above the normal flow point, approximately 90° C., of the unfixed photoresist.

The wafer is then coated with 100% HMDS spun dry at 3200 RPMs. This performs the same function as in the previous steps where to provide better adhesion between the second photoresist layer and the underlying unetched substrate.

The surface is then coated with a second positive photoresist AZ 111S spun at 3200 RPMs. This is as shown in FIG. 4.

There is then a baked step at 95° C. for 15 minutes. This is followed by an exposure step. Again a Perkin Elmer 221 printer used. The exposed positive photoresist was then developed using AZ311 developer 2:3 distilled H2O 22° C. The developed wafer is shown in FIG. 5.

A baked step at 85° C. for 20 minutes followed. After which there was a boron implant at 90 Kev. The goal here is to provide additional protection during this field implant for silicon nitride lines. This allowed the use of higher energy, e.g., 90 Kev, versus 35 Kev as will be used without the double photoresist layer. The ion implantation of this type is used to produce a number of circuits which require raising the background dopent level and to short out various transistors which may exist in the body of the silicon that have been put there previously. An example is in programmable rom production. This will also provide a deeper implantation, for example with a higher background voltage for a field layer. n-channel MOS transistors can have higher voltages with the field implantation. Further, high voltage field implantations may be used to avoid transistor effect between the edges and the drain connections of the MOS. An example of higher voltage MOS is in the 30 to 35 volt range. While these are examples of the use of a double photoresist to permit higher field implantations, it will be appreciated that the present invention is a general technique which will find many applications in many different devices.

The feature of being able to make the fixed first photoresist layer at a higher temperature is important in several respects. The higher temperature bakes following the fixing of the first photoresist layer permits the removal of water from the surface more efficiently, and this, in turn, increases the adhesion of the photoresist that is subsequently applied and thus prevents peeling of the photoresist.

Other examples where high temperature bakes are needed and with the fixing of the photoresist will find application include wet oxide etching, dry aluminum etching, or wet aluminum etching.

Results of the process have been favorable. The original mask II retained its integrity, although it became slightly wrinkled from the 140° bake. There was no loss of resist dimensions over the nitride lines, and the total loss of resist thickness was less than 3000 angstroms. The second mask dimensions were center of specification, and there was no evidence of lifting or peeling in those areas where the second mask XX overlapped the first mask II.

After the implantation step, the photoresists, II and XX, are stripped. This is done in 15 minutes ultrasonic acetone, 5 minutes DMF 90° C., and 10 minutes 1:1 sulfuric: nitric acids and 150° C.

A second example of the process of the invention is set forth below. The different steps are listed in turn.
EXAMPLE
Bake: 200° C. 30 minutes
Coat: 100% HMDS 2000 RPM dry
Coat: KTI 809 32% solids 3500 RPM Tres.=1.2 m
Bake: 90° C. 30 minutes
Expose: Kasper contact aligner 25002 mask2 12 secs.
Develop: KTI 809 developer 1:1 DI water 22° C.
Bake: 90° 30 minutes
Plasma: LFE - 302 barrel etcher with cage
    Descum: 3.0 minutes 7.0 Torr 100 watts 100% $O_2$
    Etch: 2.5 minutes 2.0 Torr 100 watts 92% $Cf_4$ 8% $O_2$
Bake: 150° C. 45 minutes
Coat: 100% HMDS 2000 RPM dry.
Coat KTI 809 32% solids 3500 RPM Tres=1.2 m
Bake: 90° 30 minutes
Expose: Kasper contact printer 25002 mask 21 14 seconds
Develop: KTI 809 developer 1:1 DI water 22° C.
Descum: LFE 302 barrel etcher without cage 3.0 minutes 7.0 Torr 100 watts 100% $O_2$
Bake: 90° C. 15 minutes
Implant: Boron 90 Kev
Strip: 15 minutes ultrasonic acetone
    5 minutes DMF 90° C.
    10 minutes 1:1 sulfuric—nitric 150° C.

Some of the differences between the first example and the second example should be noted. The two different photoresists are both commercially available ones, and any convenient or conventional commercial photoresist may be used. In the exposing step, any convenient or conventional aligner may be used. In the plasma etching step, as noted above, it is preferable that the etching be with a uniform energy per unit surface area. A Planar etcher (first example) is better than a Barrel etcher (second example) because the energy is more uniformly distributed.

With regard to the plasma gas, any convenient or conventional plasma gas may be used, and $CF_4$, $N_2$, Argon, $SF_6$, Helium, or any of the chlorine-based plasmas are satisfactory.

In the second example, there is included a descum step. If the plasma is uniform, and the exposure of the photoresist is complete or overexposed, then there is no scum formation. An example in using the KTI resist is an exposure time at least 12 seconds with 20-25 MW/$CM^2$ is satisfactory. If not fully exposed, and if not fixed with adequate energy in the plasma step, there can be caused in the first layer II a spewing of unexposed resist into the fine dimension during the second development. This manifests itself as a mottled blue-yellow scum typically between the lines. This, however, can be remedied by using an extended de-scum, which is set forth in the second example.

Figure 6:
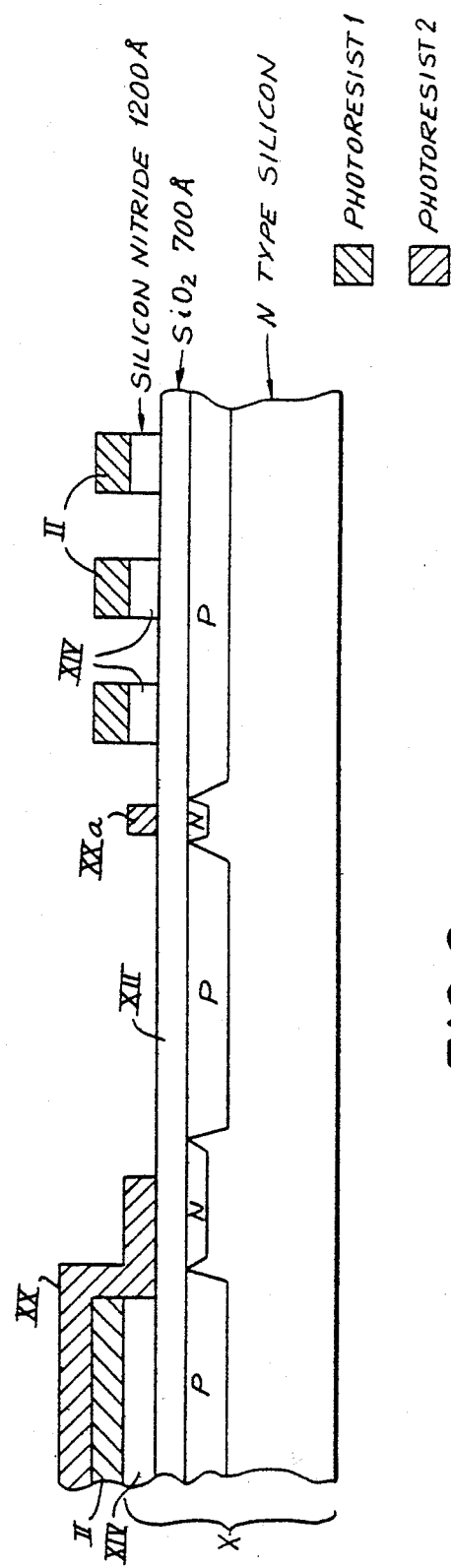
FIG. 6 is a partial cross-sectional view, not to scale, of a portion of an integrated circuit, being manufactured in accordance with an aspect of this invention.

FIG. 6 shows a partially cross-sectional view, not to scale, of a chip fabricated in accordance with the invention.

FIG. 6 shows the wafer just prior to the implantation step. The substrate X is shown here with the silicon nitride layer XIV etched away in part, the silicon dioxide layer not being etched at all, and with previously diffused P and N regions in different portions of the base X. The first photoresist layer II covers the silicon nitride layer XII where it has not been etched by plasma. The second photoresist layer XX extends over a portion of the first photoresist layer II and onto the substrate overlying adjacently a portion of the $SiO_2$ layer XII. A second portion of second photoresist XXa lies directly over the $SiO_2$ layer towards the center, over a region of the substrate which is not to be implanted. It will be appreciated that FIG. 6 is only an example of one small portion of an integrated circuit chip. Other device configurations may be achieved with dual layer positive photoresists. Further modification might be in the etching step, not to cut into the substrate significantly, i.e., a very short plasma etch, just sufficient to fix the photoresist, then to be followed by another step. The invention has been described specifically with regard to plasma etching; however, it is not limited thereto and may include high temperature bakes for wet oxide etching, wet aluminum etching, or dry aluminum etching, as well as a host of other processes where a positive photoresist with high-baked temperatures is needed.

There has been described two examples, including the best mode known by the inventor, for practicing the process of the invention, and there have been shown and described several examples of devices using the invention.

I claim:
1. A method of fabricating a semi-conductor device comprising the steps of:
(a) forming a first layer of positive photoresist on a substrate surface;
(b) exposing selected portions of said photoresist layer;
(c) developing said layer to remove those portions which were exposed, and leaving those other portions which were not exposed;
(d) plasma etching said substrate and said unexposed resist so that the plasma etch fixes said unexposed photoresist;

(e) forming a second layer of photoresist over said fixed first layer and said etched substrate; and
(f) exposing and developing selected portions of said second layer of photoresist being non-congruent with said unexposed fixed left first photoresist;
thereby forming a double photoresist layer where said second layer is over said fixed first layer; and wherein in step (b) said photoresist is fully exposed; and
wherein said photoresist is overexposed to avoid spewing of said photoresist during step (f).

2. A method according to claim 1 comprising the further step of (g) ion implanting said substrate, said double photoresist layer providing a thick barrier to said implant, and permitting a high energy of implantation.

3. A method according to claim 2 wherein said implantation is done with an energy greater than 75 Kev.

4. A method according to claim 1 wherein said plasma has a minimum power of 5 watts/cm$^2$.

5. A method according to claim 1 wherein said plasma is applied in a planar etcher, thereby uniformly fixing said unexposed resist.

6. A method according to claim 1 further comprising between steps (d) and (e) the further step of heating, said heating be done at a temperature 50° to 100° C. above the normal flow point temperature of the unfixed first photoresist.

* * * * *